United States Patent
Zhang et al.

(10) Patent No.: US 6,203,864 B1
(45) Date of Patent: Mar. 20, 2001

(54) METHOD OF FORMING A HETEROJUNCTION OF A CARBON NANOTUBE AND A DIFFERENT MATERIAL, METHOD OF WORKING A FILAMENT OF A NANOTUBE

(75) Inventors: Yuegang Zhang; Sumio Iijima, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/327,510

(22) Filed: Jun. 8, 1999

(30) Foreign Application Priority Data

Jun. 8, 1998 (JP) .................................................. 10-158765
Apr. 16, 1999 (JP) .................................................. 11-147041

(51) Int. Cl.$^7$ ............................ C01B 31/30; B01J 19/00; B01J 19/08
(52) U.S. Cl. ...................... 427/592; 427/294; 427/372.2; 427/399; 427/228; 423/345; 423/439
(58) Field of Search .................................... 427/592, 227, 427/228, 249.1, 249.16, 249.17, 249.18, 249.19, 255.4, 294, 372.2, 399; 423/345, 439; 428/367

(56) References Cited

FOREIGN PATENT DOCUMENTS 0 603 888 6/1994 (GB).
09/30570 * 10/1996 (WO).

OTHER PUBLICATIONS

M.S. Dresselhaus et al., "Science of Fullerenes and Carbon Nanotubes", Academic Press, New York, (1996), pp. 802–815.
H. Dai et al., "Synthesis and characterization of carbide nanorods", Nature, vol. 375, Jun. 29, 1995, pp. 769–772.
D. Zhou et al., "Production of silicon carbide whiskers from carbon nanoclusters", Chemical Physics Letters, vol. 222, (1994), pp. 238–238 with Abstract.

S. Iijima et al., "Pentagons, heptagons and negative curvature in graphite microtubule growth", Nature, vol. 356, (1992), pp. 776–778.
H. Dai et al., "Nanotubes as nanoprobes in scanning probe microscopy", Nature, vol. 384, Nov. 14, 1996, pp. 147–150.
S.S. Wong et al., Covalently functionalized nanotubes as nanometre–sized probes in chemistry and biology, Nature, vol. 394, Jul. 2, 1998, pp. 52–55.
S.J. Tans et al., "Room–temperature transistor based on a single carbon nanotube", Nature, vol. 393, May 7, 1998, pp. 49–52.
Jean–Marc Bonard et al., "Field emission from single–wall carbon nanotube films", Applied Physics Letters, vol. 73, Aug. 17, 1998, pp. 918–920.
Y. Zhang et al., "Microscopic structure of as–grown single–wall carbon nanotubes by laser ablation", Philosophical Magazine Letters, vol. 78, No. 2, (1998), pp. 139–144 with Abstract.
W. Han et al., "Continuous synthesis and characterization of silicon carbide nanorods", Chemical Physics Letters, vol. 265, Feb. 7, 1997, pp. 374–378 with Abstract.

* cited by examiner

Primary Examiner—Michael W. Ball
Assistant Examiner—Michael A. Tolin
(74) Attorney, Agent, or Firm—Sughrue, Mion, Zinn, Macpeak & Seas, PLLC (57) ABSTRACT

A carbon nanotube is contacted with a reactive substance which is a metal or a semiconductor. The reactive substance is heated to diffuse atoms of the reactive substance into the carbon nanotube so that the carbon nanotube is partially transformed or converted into carbide as a reaction product. Thus, a heterojunction of the reaction product and the carbon nanotube is formed. For example, the carbon nanotube (2) is contacted with a silicon substrate (1). The silicon substrate (1) is heated to cause solid-solid diffusion of Si. As a result, SiC (3) is formed as the heterojunction. At least a part of a filament material of a carbon nanotube is irradiated with electromagnetic wave to deform the filament material.

6 Claims, 6 Drawing Sheets

Light off

FIG. 3A (b)

Light on

METHOD OF FORMING A HETEROJUNCTION OF A CARBON NANOTUBE AND A DIFFERENT MATERIAL, METHOD OF WORKING A FILAMENT OF A NANOTUBE

BACKGROUND OF THE INVENTION

This invention relates to a method of forming a heterojunction of a carbon nanotube and a different material and, in particular, to a method of forming a heterojunction of a carbon nanotube and carbide.

This invention relates also to a filament, a method of inducing an electric current therein, and a method of working the same and, in particular, to a filament having a nanostructure and adapted for use in a micromachine and an electron source, a method of inducing an electric current therein, and a method of working the same.

A so-called heterojunction formed by heterogeneous or different materials is an important structure in order to utilize material-specific characteristics in an electronic device.

A carbon nanotube comprises a graphite sheet composed of six-member carbon rings and has a cylindrical structure formed by rolling the graphite sheet in a manner such that the six-member carbon rings are aligned in a helical fashion.

The carbon nanotube, together with a spherical fullerene represented by $C_{60}$, is expected as a useful material for an electronic device because of its specific electric characteristics. Particularly, attention is directed to a bond of the carbon nanotube and carbide.

This is because carbide itself has very interesting electric characteristics. For example, SiC has semiconducting features. TiC has metallic features. $Fe_3C$ acts as a ferromagnetic material. NbC attracts the attention as a superconducting material. $BC_x$ serves as an insulator. Thus, carbide has a wide variety of electric characteristics.

On the other hand, a single-wall carbon nanotube has specific electric characteristics. That is, the single-wall carbon nanotube acts as a semiconductor or a metal in dependence upon a diameter and a helical condition (an angle formed between an axial direction of the nanotube and an aligning direction of carbon atoms) (M. S. Dresselhaus et al "Science of Fullerenes and Carbon Nanotubes" (Academic Press, New York, 1996)). It is expected that various functional devices can be achieved by a combination of carbide and the carbon nanotube.

However, no conventional technique exists to form such heterojunction of carbide and the carbon nanotube. This is because the carbon nanotube has a very high Young's modulus and is therefore difficult to be mechanically processed or deformed In order to produce a carbide nanorod using the carbon nanotube as a starting material, use has been made of a technique of contacting a multiwall carbon nanotube with volatile oxide such as SiO and $B_2O_2$ or halide such as $SiI_4$, $TiI_4$, $NbI_4$, and $FeCl_3$ to cause high-temperature reaction (H. Dai et al "Synthesis and characterization of carbide nanorods", Nature, Vol. 375, pp. 769–772, (1995); D. Zhou et al "Production of silicon carbide whiskers from carbon nanoclusters", Chem. Phys. Lett., Vol. 222, pp. 233–238 (1994); W. Ran et al "Continuous synthesis and characterization of silicon carbide nanorods", Chem. Phys. Lett., Vol. 265, pp. 374–378 (1997)). Another technique is disclosed in EP 60388 A2 (1993) in which carbon fiber is transformed or converted into a SiC rod by the use of SiO vapor.

In the above-mentioned techniques of producing the carbide nanorod by the use of vapor-solid reaction, the carbon nanotube is exposed to reactive vapor to transform a whole of the carbon nanotube into carbide. Therefore, those techniques can not be applied to formation of the heterojunction. In other words, in order to realize the heterojunction, a part of the carbon nanotube must be selectively transformed into carbide with a remaining part protected from the reaction. However, no conventional technique can achieve such selective reaction.

Since a single-wall carbon nanotube (SWCNT) having a nanostructure has been discovered (Iijima et al, "Pentagons, heptagons and negative curvature in graphite microtubule growth", Nature, vol. 356, p776, (1992)), physical properties of the SWCNT are gradually revealed and research and development for practical applications are actively carried out.

The SWCNT comprises a hexagonal network graphite plane rolled into a cylindrical shape. The SWCNT has an electron structure widely varied depending upon a tube diameter and a chiral angle. Therefore, the electric conductivity of the SWCNT is variable between that of a metal and that of a semiconductor. The SWCNT is believed to have a feature similar to one-dimensional electric conductivity.

For example, the SWCNT is applicable to a filament having a nanostructure. For use as the filament, the SWCNT must be deformed into a desired shape. A technique of selectively deforming the SWCNT is expected to be useful in application to micromachines and in facilitating the preparation of high-resolution probes (see H. Dai et al "Nanotubes as nanoprobes in scanning probe microscopy", Nature, Vol. 384, pp. 147–150 (1996) and S. S. Wong et al "Covalently functionalized nanotubes as nanometre-sized probes in chemistry and biology", Nature, Vol. 394, pp. 52–55 (1998)).

On the other hand, a technique of selectively feeding an electric current to the filament having a nanostructure, such as the SWCNT, shows a possibility of development of electronic devices having a microstructure (S. J. Tans et al "Room-temperature transistor based on a single carbon nanotube", Nature, Vol. 393, pp. 49–52 (1998)). In addition, this technique is useful as one of the high-resolution techniques in analysis evaluation. Thus, this field of technique is highly expected To meet such expectation, proposal is made of a filament of a field emission type (Jean-Marc Bonard et al "Field emission from single-wall carbon nanotube films", Appl. Phys. Lett. Vol. 73, pp. 918–920 (1998)). The filament comprises a plurality of SWCNT filaments scattered over a plurality of electrodes formed on a substrate. By applying a predetermined voltage between the electrodes, electrons are emitted from the filaments.

As compared with a typical thermionic emission type, the above-mentioned filament is advantageous in the following respects. Specifically, heating is unnecessary so that energy efficiency is high. The filament comprises carbon atoms alone and is manufactured at a low cost. In recent years, much attention is directed to this field of technique.

In order to individually and selectively deform the filament, for example, a manipulation technique is necessary. Manipulation of those filaments using the SWCNTs and having a nanostructure requires high resolution comparable to that required in manipulation of atoms. Therefore, it is in fact impossible to selectively deform the filament.

In addition, there is no existing technique of selectively inducing an electric current in the filament of a nanostructure. Thus, it is impossible to selectively induce the electric current in the filament using the SWCNT having a nanostructure.

SUMMARY OF THE INVENTION

It is therefore an object of this invention to provide a method of forming a heterojunction of a carbon nanotube and carbide, which is useful for an electronic device.

It is therefore an object of this invention to provide a filament such as a SWCNT having a nanostructure which can be individually and selectively deformed into a desired shape.

It is another object of this invention to provide a filament such as a SWCNT having a nanostructure in which an electric current can be selectively induced.

It is still another object of this invention to provide a method of inducing an electric current in the above-mentioned filament.

It is yet another object of this invention to provide a method of selectively deforming the filament.

According to this invention, there is provided a method of producing a heterojunction of a carbon nanotube and carbide, wherein a part of the carbon nanotube is contacted with a reactive substance to cause reaction of the carbon nanotube and the reactive substance by solid-solid diffusion.

With the above-mentioned method, the reaction of the carbon nanotube is restricted to a contacting area where the carbon nanotube is contacted with the reactive substance and an adjacent zone around the contacting area. In a most part of a noncontacting area, the carbon nanotube is not changed in structure. Therefore, it is possible to form a heterojunction of the carbon nanotube and carbide.

According to this invention, there is provided a filament comprising a filament material which is deformed by irradiation of electromagnetic wave to at least a part thereof.

Preferably, the filament material is a nanotube.

Preferably, the nanotube is a single-wall nanotube.

Preferably, the nanotube has a bundled structure.

Preferably, the nanotube is a carbon nanotube a

According to this invention, there is provided a method of inducing an electric current in a filament, comprising the step of irradiating at least a part of a filament material with electromagnetic wave to selectively induce the electric current in the filament material.

According to this invention, there is provided a method of working a filament, comprising the step of irradiating at least a part of a filament material with electromagnetic wave to deform the filament material.

Preferably, the electromagnetic wave is visible light.

DESCRIPTION OF THE PREFERRED EMBODIMENTS

Now, description will be made about a preferred embodiment of this invention with reference to the drawing.

As a reactive substance, use is made of a metal such as Ti, W, Mo, V, Fe, and Nb or a semiconductor such as Si. A part of a carbon nanotube is contacted with the reactive substance. Preferably, the reactive substance is held in a vacuum or an inactive gas. At least the reactive substance is heated to diffuse the reactive substance towards the carbon nanotube. Thus, the reaction between the carbon nanotube and the reactive substance proceeds.

Embodiment

A heterojunction of a single-wall carbon nanotube and SiC was formed by the use of single crystal silicon as a reactive substance. At first, a (111) plane silicon wafer was cut into a dimension of about 7 mm long and about 3 mm wide in a direction perpendicular to a substrate. Thereafter, mechanical polishing was performed until the thickness of a center portion is reduced to the order of several tens of microns. Then, chemical etching was performed until the thickness is further reduced to the order of several tens of nanometers. Thus, a silicon substrate 1 was prepared. As an etchant, a mixed solution of HF and $HNO_3$ ($HF:HNO_3=1:4$) was used. An oxide film on the surface of the silicon substrate was removed by chemical etching.

Figure 1A:
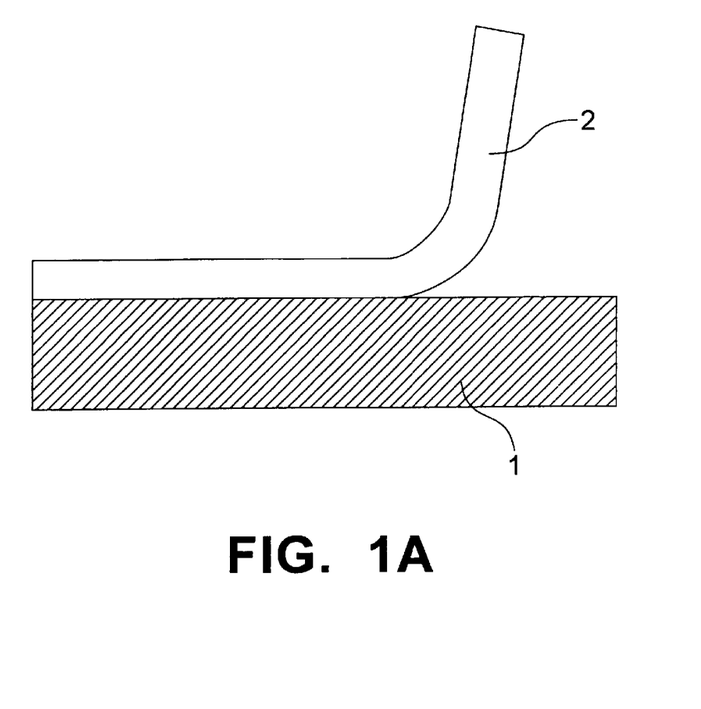
FIGS. 1A and 1B are schematic views for describing a method of forking a heterojunction according to this invention.

A number of single-wall carbon nanotubes 2 prepared by laser ablation were dispersed in ethanol and put on the silicon substrate 1 prepared as described above. In this event, most of the carbon nanotubes 2 were extended, heavily bent, or bundled together. After ethanol was evaporated from the silicon substrate 1, each of the carbon nanotube 2 was placed on the silicon substrate 1 with its three-dimensional structure maintained. As a result, the silicon substrate 1 and the carbon nanotube 2 were partially contacted in a small area (FIG. 1A). Thus, a sample was prepared.

Then, the sample was mounted on a heating stage of a ultra-high-vacuum transmission electron microscope (UHV-TEM, JEM-2000FXVII). A vacuum chamber was evacuated to a pressure between $10^{-9}$ and $10^{-8}$ Torr.

The silicon substrate 1 was directly supplied with an electric current to beat the sample. As a result of measurement by a pyrometer, the highest temperature of the silicon substrate 1 was about 1000° C. When the temperature became higher than about 800° C., surface migration of silicon was observed.

Figure 1B:
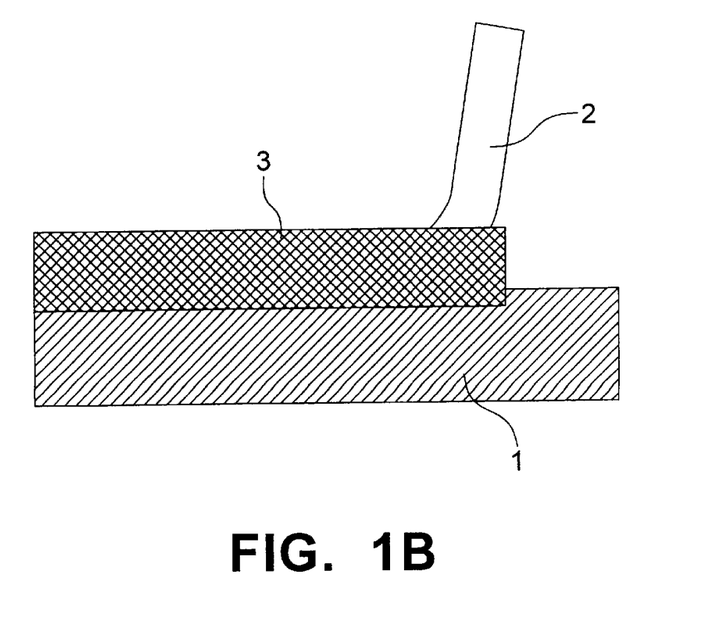
Figure 2A:
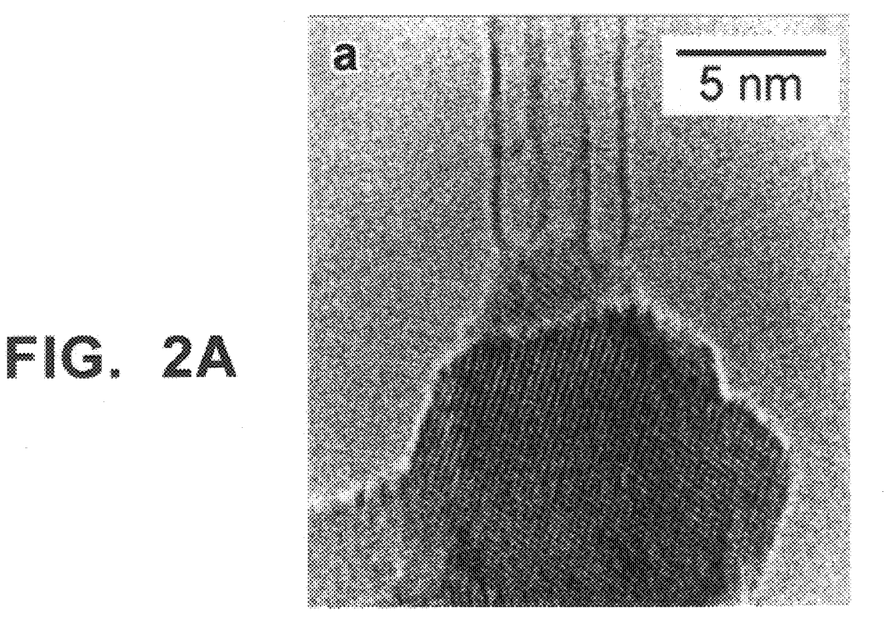
FIG. 2A is an electron micrograph showing a heterojunction of a bundle of a plurality of single-wall carbon nanotubes and SiC.
Figure 2B:
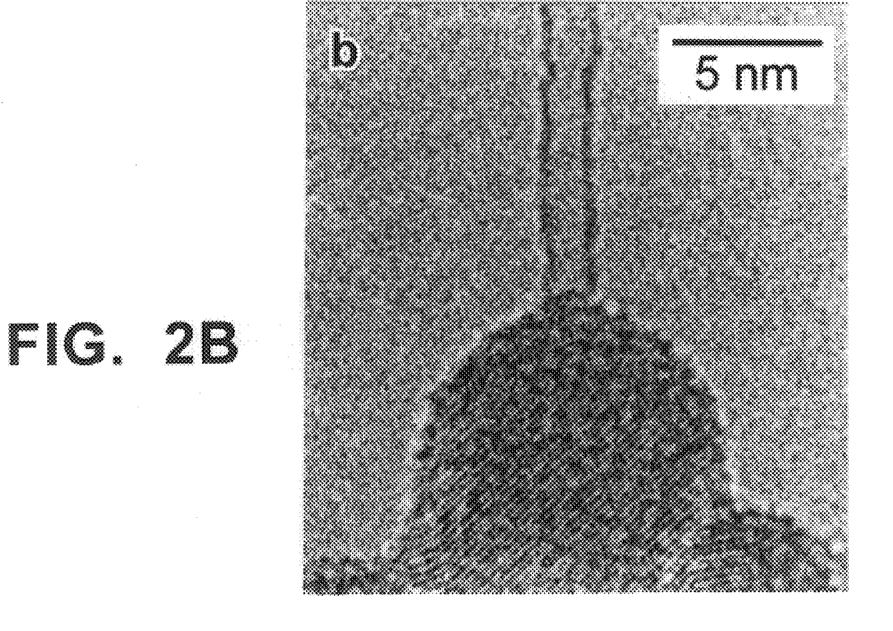
FIG. 2B is an electron micrograph showing a heterojunction of a single-wall carbon nanotube and SiC.

By observation through the transmission electron microscope (TEM), it was confirmed that heating for several minutes caused local reaction of silicon and the single-wall carbon nanotube to produce SiC 3 (FIG. 1B). Heating was carried out for different heating periods controllably varied within a range from several minutes to one hour. However, no difference in appearance was observed in dependence upon the heating periods. The heterojunction of the single-wall carbon nanotube and SiC thus obtained was shown in each of FIGS. 2A and 2B as a micrograph taken by the TEM. FIG. 2A shows the heterojunction of a bundle of a plurality of single-wall carbon nanotubes and SiC while FIG. 2B shows the heterojunction of one single-wall carbon nanotube and SiC.

Although the preferred embodiment has been described in the foregoing, this invention is not restricted thereto but can be modified in various manners within the scope of this invention. For example, not only the single-wall carbon nanotube but also a multiwall carbon nanotube can be used. In the foregoing embodiment, heating was performed by feeding the electric current to the substrate. Alternatively, the electric current may be supplied between the carbon nanotube and the substrate. Instead of the electric current, use may be made of any other heating means such as infrared radiation. The heating may be performed not only in the vacuum but also in an argon or a nitrogen atmosphere.

As described above, the method according to this invention comprises the step of partially contacting the carbon nanotube with the reactive substance to cause the reaction between carbon nanotube and the reactive substance by solid-solid diffusion of the reactive substance. Thus, by the above-mentioned method which is very simple, it is possible to selectively form the heterojunction between a part of the carbon nanotube and carbide. The heterojunction of the carbon nanotube and carbide achieved by this invention is useful in formation of electronic devices and will make a great contribution to electronic industry.

Now, description will be made about a filament according to one embodiment of this invention as well as a method of inducing an electric current in the filament and a method of working the filament.

The filament having a nanostructure comprises a filament material on the order of nanometers. At least a part of the filament material is irradiated with electromagnetic wave such as visible light to deform the filament material into a desired shape, for example, an arcuate shape or a η shape As the filament material, use is advantageously made of a nanotube (NT), particularly, a single-wall carbon nanotube (SWCNT) or a plurality of SWCNTs in a bundled structure.

Next, the method of working the filament will be described.

At first, a SWCNT as the filament material is formed by laser ablation known in the art (see Y. Zhang et al "Microscopic structure of as-grown single-wall carbon nanotubes by laser ablation", Philosophical Magazine Letters, Vol. 78, No. 2, pp. 139–144 (1998)).

Specifically, a graphite target containing 1.2 at % of Ni and Co as catalysts was placed in a furnace heated to 1200° C., kept at a pressure of 500 Torr, and supplied with an Ar gas at a flow rate of about 300 sccm. By the use of a Nd-doped YAG (yttrium-aluminum-garnet) laser, the graphite target was irradiated with second harmonic produced by the YAG laser to obtain the SWCNT. The second-order harmonic wave has a pulse width of about 8 ns and energy per pulse of about 3 J/cm$^2$.

Then, the SWCNT was put in a sample cell having a quartz window with two electrodes arranged inside.

Within the sample cell, the SWCNT guided by a stream of the Ar gas was caught between the electrodes. Thereafter, the sample cell is evacuated to a pressure of 0.1 Torr.

Next, the SWCNT was irradiated through the quartz window of the sample cell with visible light emitted from a halogen lamp of 150W to obtain a filament deformed into a desired shape.

Figure 3A:
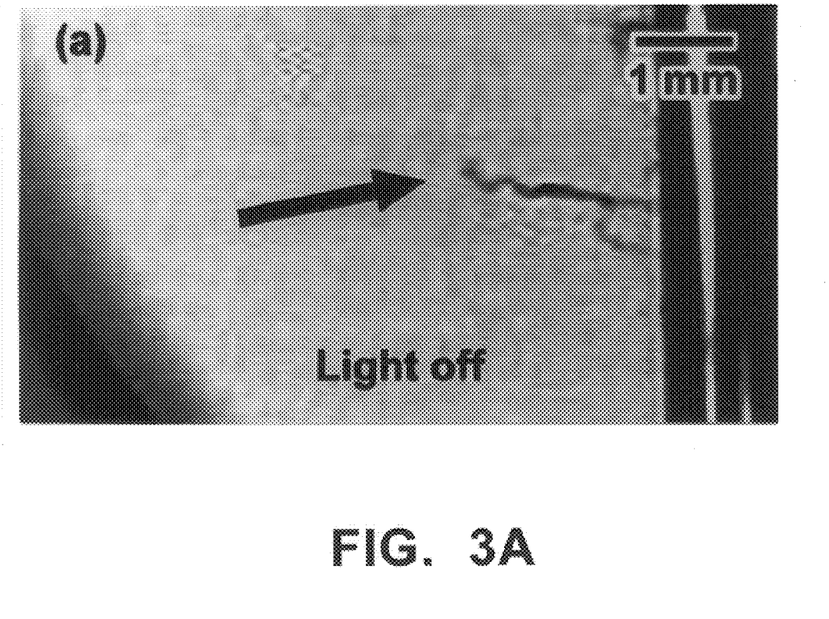
FIGS. 3A and 3B are optical micrographs for describing a method of working a filament according to one embodiment of this invention.
Figure 3B:
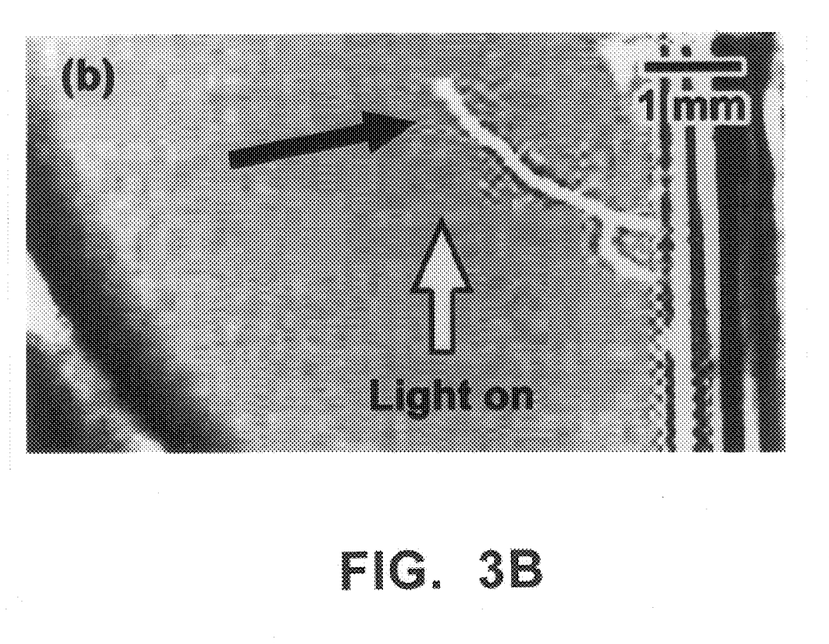

Referring to FIGS. 3A and 3B, the filament before and after irradiation of the visible light is shown, respectively. Herein, the visible light had irradiation energy of about 20 mW/cm$^2$.

As will be understood from FIGS. 3A and 3B, the filament can be deformed into a desired shape by simply irradiating the filament with the visible light. The deformation of the filament can be controlled by selecting the irradiation energy of the visible light and the irradiation area of the filament.

Figure 4A:
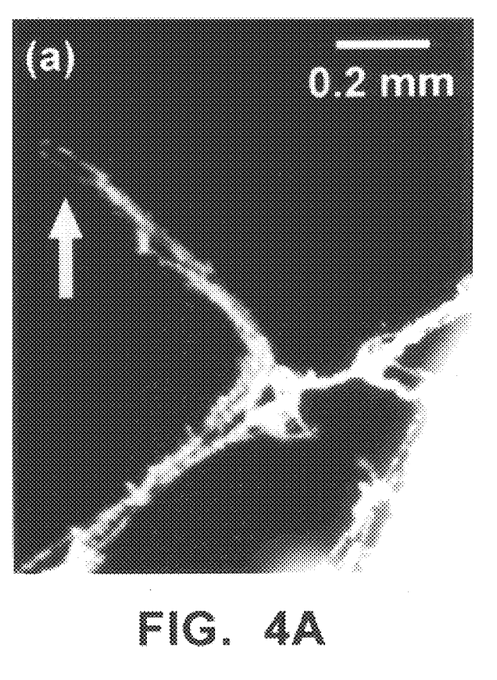
FIGS. 4A and 4B are optical micrographs showing deformation of the filament illustrated in FIGS. 3A and 3B at different levels of irradiation energy.
Figure 4B:
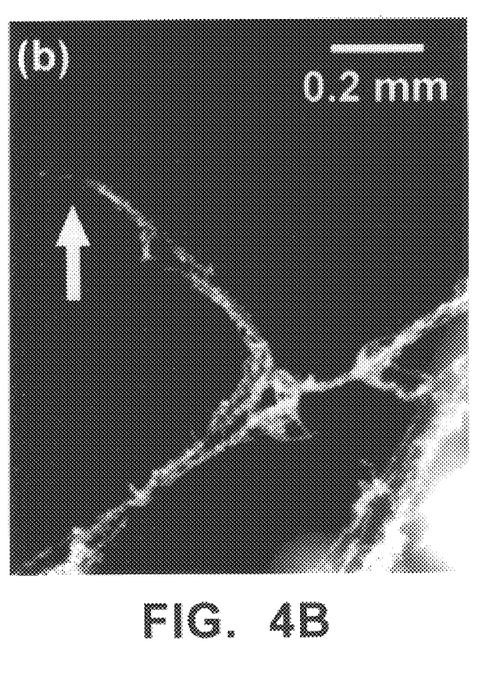

Referring to FIGS. 4A and 4B, the deformation of the filament is dependent upon the level of the irradiation energy. In FIG. 4A, the visible light had the irradiation energy of 30 mW/cm$^2$. In FIG. 4B, the visible light had the irradiation energy of 5 mW/cm$^2$.

As seen from FIGS. 4A and 42, the deformation of the filament apparently depends upon the level of the irradiation energy.

Figure 5:
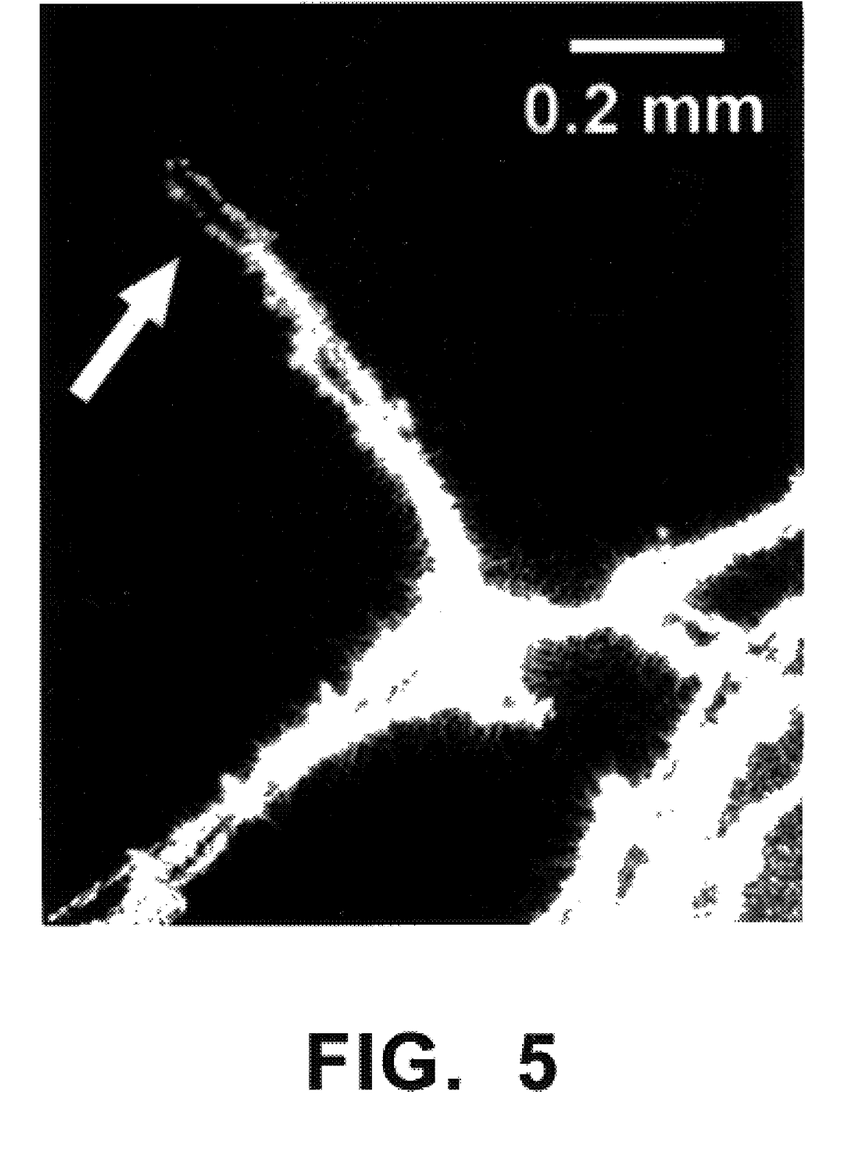
FIG. 5 is an optical micrograph showing the filament illustrated in FIGS. 3A and 3B irradiated with a laser beam.

Referring to FIG. 5, the filament was irradiated with a laser beam having a wavelength of 632 nm and irradiation energy of about 800 mW/cm$^2$ by the use of a He-Ne laser. The deformation of the filament was substantially equivalent to that of the filament illustrated in FIG. 4A.

Figure 6:
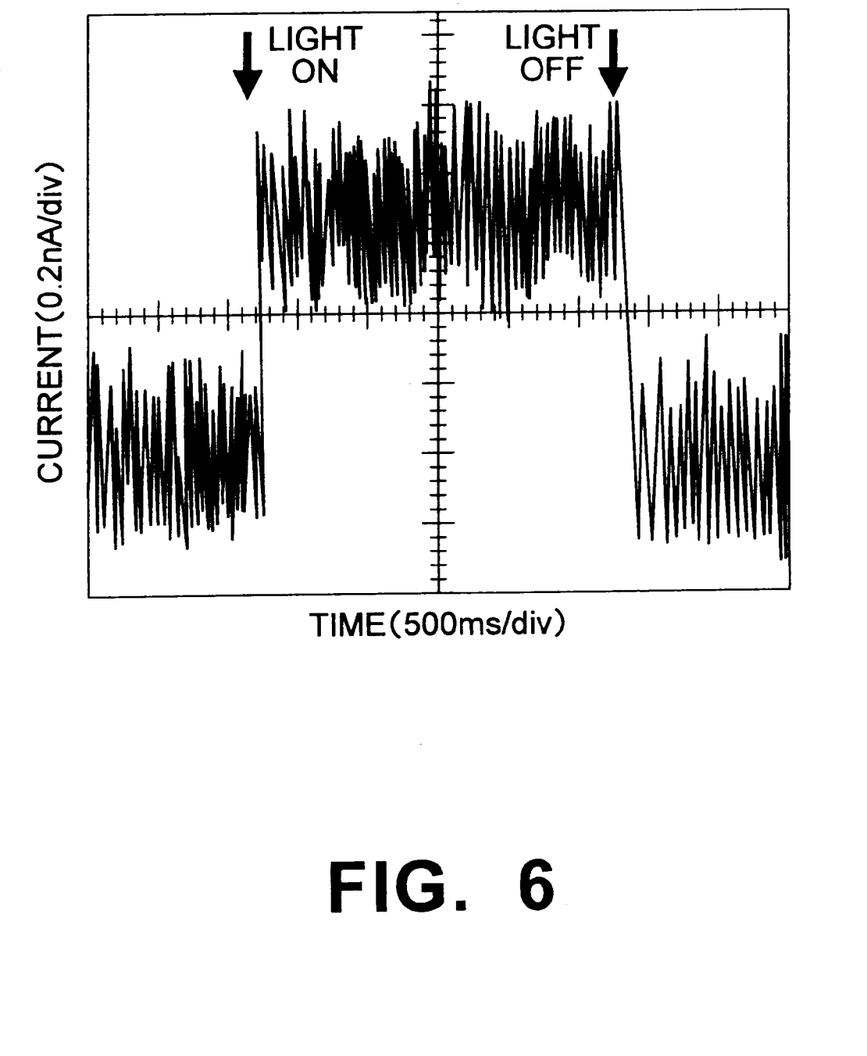
FIG. 6 is a view showing the result of measurement of an electric current induced in the filament illustrated in FIG. 5.

Referring to FIG. 6, an electric current was induced in the filament when the filament was irradiated at the center between two electrodes with a laser beam having a wavelength of 632 nm and irradiation energy of about 800 mw/cm$^2$ by the use of a He-Ne laser. The result of measurement of the electric current is illustrated in the figure.

As seen from FIG. 6, it is possible to selectively induce the electric current in the filament by irradiating the filament with the laser beam.

According to this embodiment, it is possible to individually and selectively deform the filament of a nanostructure such as SWCNT by irradiating the filament with electromagnetic wave such as visible light.

It is also possible to induce the electric current in the filament by irradiating the filament with electromagnetic wave such as visible light.

In each of the above-mentioned operations, it is sufficient to simply irradiate at least a part of the filament with the electromagnetic wave such as visible light. Thus, the operation is very simple and convenient. The filament can be applied as a nanoelectronics element.

In the foregoing, description has been made about one embodiment of the filament, the method of inducing the electric current in the filament, and the method of working the filament. However, this invention is not restricted to the foregoing embodiment but can be modified in various manners within the scope of this invention.

For example, the halogen lamp and the He-Ne laser are used in the foregoing embodiment. However, similar effect is achieved by the use of any other light or energy source.

As described above, according to this invention, it is possible to individually and selectively deform the filament of a nanostructure such as the SWCNT into a desired shape.

By irradiating the filament with electromagnetic wave such as visible light, it is possible to selectively induce the electric current in the filament.

What is claimed is:

1. A method of forming a heterojunction of a carbon nanotube and a different material, comprising the step of contacting said carbon nanotube with a reactive substance to cause reaction between a part of said carbon nanotube and said reactive substance so that a bond of a reaction product and said carbon nanotube is formed as said heterojunction.

2. A method as claimed in claim 1, wherein the reaction between said carbon nanotube and said reactive substance is performed by solid-solid diffusion using said reactive substance as a diffusion source.

3. A method as claimed in claim 1, wherein said reactive substance is a metal or a semiconductor.

4. A method as claimed in claim 1, wherein the reaction between said carbon nanotube and said reactive substance is performed in a vacuum or in an inactive gas.

5. A method as claimed in claim 1, wherein the reaction between said carbon nanotube and said reactive substance is performed in a heated condition such that at least the reactive substance is heated.

6. A method as claimed in claim 5, wherein said heated condition is caused by feeding an electric current to said reactive substance or between said carbon nanotube and said reactive substance.

* * * * *